United States Patent
Singh et al.

(10) Patent No.: US 10,108,374 B2
(45) Date of Patent: Oct. 23, 2018

(54) MEMORY CONTROLLER FOR PERFORMING WRITE TRANSACTION WITH STALL WHEN WRITE BUFFER IS FULL AND ABORT WHEN TRANSACTION SPANS PAGE BOUNDARY

(71) Applicant: FREESCALE SEMICONDUCTOR, INC., Austin, TX (US)

(72) Inventors: Harsimran Singh, Patiala (IN); Neeraj Chandak, Noida (IN); Snehlata Gutgutia, Jamtara (IN); Vivek Singh, Noida (IN)

(73) Assignee: NXP USA, INC., Austin, TX (US)

( * ) Notice: Subject to any disclaimer, the term of this patent is extended or adjusted under 35 U.S.C. 154(b) by 134 days.

(21) Appl. No.: 15/207,506

(22) Filed: Jul. 12, 2016

(65) Prior Publication Data

US 2018/0018131 A1 Jan. 18, 2018

(51) Int. Cl.
| | |
|---|---|
| G06F 3/06 | (2006.01) |
| G11C 7/22 | (2006.01) |
| G11C 7/10 | (2006.01) |
| G11C 8/00 | (2006.01) |

(52) U.S. Cl.
CPC .......... *G06F 3/0659* (2013.01); *G06F 3/061* (2013.01); *G06F 3/0656* (2013.01); *G06F 3/0673* (2013.01); *G11C 7/10* (2013.01); *G11C 7/22* (2013.01); *G11C 8/00* (2013.01)

(58) Field of Classification Search
CPC ...... G06F 3/061; G06F 3/0656; G06F 3/0673; G06F 3/0659; G06F 3/0658; G11C 7/10; G11C 7/22; G11C 8/00

USPC ......................................................... 711/154
See application file for complete search history.

(56) References Cited

U.S. PATENT DOCUMENTS

| | | | | |
|---|---|---|---|---|
| 5,835,972 A | * | 11/1998 | Choate | G06F 9/30032 711/134 |
| 5,897,667 A | * | 4/1999 | Miller | G06F 13/4027 710/310 |
| 6,321,310 B1 | * | 11/2001 | McCarthy | G06F 13/28 710/20 |
| 6,708,257 B2 | | 3/2004 | Bao | |
| 8,392,689 B1 | * | 3/2013 | Lott | G06F 3/0613 365/230.03 |
| 2003/0131185 A1 | | 7/2003 | Dover | |
| 2006/0036897 A1 | | 2/2006 | Lin et al. | |

(Continued)

*Primary Examiner* — Reginald G Bragdon
*Assistant Examiner* — Aaron D Ho
(74) *Attorney, Agent, or Firm* — Charles E. Bergere

(57) ABSTRACT

A memory controller receives first and second write transactions from a processor and stores write data in a memory. The memory controller includes an address comparison circuit, a buffer, a level control circuit, a command generator, and a control circuit. The address comparison circuit compares second and third addresses and outputs first and second write data when the second and third addresses are consecutive. The buffer stores the first and second write data and outputs buffered data based on a control signal. The level control circuit compares a size of the buffered data with a threshold size and the size of the buffer. The command generator causes a write transaction to be executed based on the comparison results, rather than having the processor initiate the transaction, which reduces the load on the processor, and the buffered write data is stored in the memory.

20 Claims, 3 Drawing Sheets

(56) References Cited

U.S. PATENT DOCUMENTS

| | | | |
|---|---|---|---|
| 2010/0217943 A1* | 8/2010 | Yamada | G06F 11/1641 711/154 |
| 2014/0215123 A1 | 7/2014 | Baryudin et al. | |
| 2015/0046759 A1* | 2/2015 | Yamada | G06F 11/1497 714/54 |
| 2015/0293880 A1 | 10/2015 | Yoon | |

* cited by examiner

MEMORY CONTROLLER FOR PERFORMING WRITE TRANSACTION WITH STALL WHEN WRITE BUFFER IS FULL AND ABORT WHEN TRANSACTION SPANS PAGE BOUNDARY

BACKGROUND

The present invention generally relates to writing data to memory, and, more particularly, to a memory controller for writing data to a memory.

Integrated circuits generally include processors, memory controllers, and memories. Often, a processor writes data (referred to as write data) to a memory by initiating a write transaction to store the write data in the memory. The write transaction includes write control data, the write data, and an address. The write control data includes information such as transaction mode, transaction type, and transaction length. The processor also generates commands such as a write enable command, a memory lock command, an address latch enable command, and the like.

The processor generates and transmits the write transaction and the commands to the memory controller, which executes the write transaction based on the commands, to store the write data in the memory. The memory controller receives the write transaction at an input data rate and stores the write data in the memory at an output data rate. As the processor generates multiple commands for every write transaction, its efficiency decreases, which in turn decreases the input data rate such that it may be less than the output data rate, which introduces latency in the execution of the write transaction.

Paged memories include one or more pages, and each page has a boundary address, which is the last address of the page indicating a page boundary. The write data is stored in the pages of the memory. Typically, when the memory controller stores the write data at a first address of a current page, the processor provides a first boundary address of the current page to the memory controller. In order to store the write data at a second address of the current page, which is consecutive to the first address of the current page, the memory controller compares the second address with the first boundary address. If the second address is not equal to the first boundary address, then the memory controller stores the write data at the second address of the current page. However, if the second address is equal to the first boundary address, the memory controller detects the page boundary and generates a handshaking signal, and then the memory controller writes the write data at a first address of a page that is consecutive to the current page. The processor receives the handshaking signal and provides a second boundary address of the consecutive or next page to the memory controller. Similarly, in order to store the write data at a second address of the next page, which is consecutive to the first address of the next page, the memory controller compares the second address of the next page with the second boundary address. However, the process of handshaking between the processor and the memory controller introduces a delay in providing the second boundary address to the memory controller, and consequently in storing the write data in the next page.

One technique to reduce the latency introduced by the processor is to generate the commands only one time and store them on a dedicated page of the memory. Then, for every write transaction, the memory controller accesses the commands from the memory instead of accessing them from the processor. Since the processor generates commands only once and not for every write transaction, its efficiency increases and the latency in the execution of the write transaction is reduced. However, this does not reduce the delay introduced due to the handshaking between the processor and the memory controller.

Another technique to overcome the aforementioned latency problem is to use a buffer to store the write data and the commands. The memory controller then is connected to the buffer to access and execute the commands. This reduces the latency, but still does not address the current page boundary detection issue.

It would be advantageous to have a memory controller that matches the input data rate with the output data rate and that can detect page boundaries.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
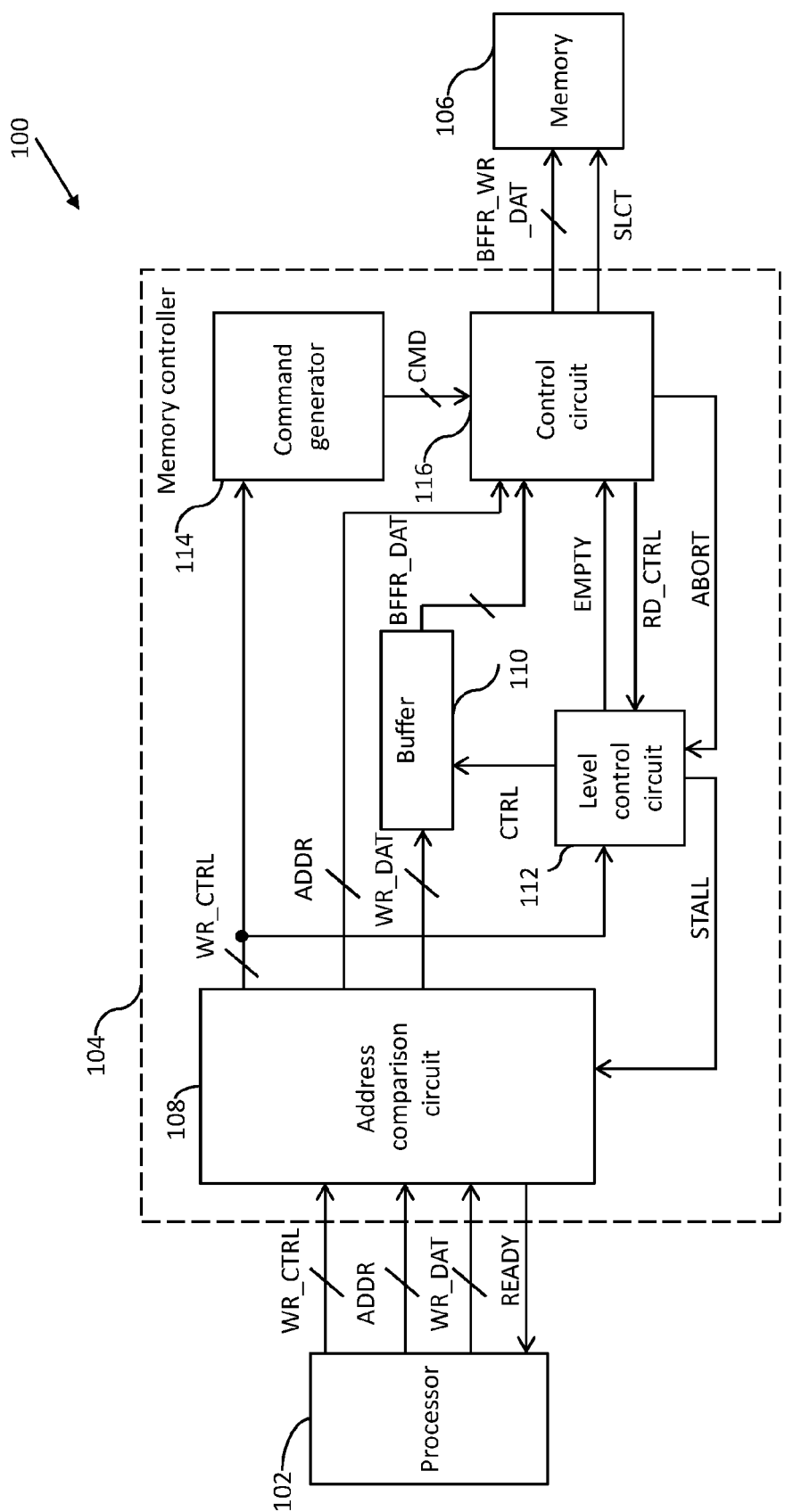
FIG. 1 is a schematic block diagram of an integrated circuit (IC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a memory controller that executes first and second write transactions. The memory controller is connected to a processor and receives the first and second write transactions from the processor, where the first write transaction includes first write control data, a first address, and first write data, and the second write transaction includes second write control data, a second address, and second write data. The memory controller includes an address comparison circuit, a buffer, a level control circuit, a command generator, and a control circuit. The address comparison circuit is connected to the processor for receiving the first and second write control data, the first and second addresses, and the first and second write data. The address comparison circuit calculates a third address based on the first write control data and the first address, and compares the second address with the third address. The address comparison circuit outputs at least one of the first and second write control data, at least one of the first and second addresses, and the first and second write data based on a stall signal and the comparison of the second and third addresses. The buffer is connected to the address comparison circuit for receiving and storing the first and second write data. The buffer outputs buffered data based on a control signal and the first and second write data. The level control circuit is connected to the control circuit and receives an abort signal and read control data. The level control circuit is connected to the address comparison circuit for receiving the at least one of the first and second write control data, and determining a size of the buffered data based on the first write control data and the read control data. The level control circuit compares a size of the buffered data with both a threshold size and a predetermined buffer size, and generates (i) the control signal based on the comparison of the size of the buffered data and the threshold size, and (ii) the stall signal based on the comparison of the size of the buffered data and the predetermined buffer size. The command generator is connected to the address comparison circuit for receiving at least one of the first and second write control data and outputs at least one command. The control circuit is connected to (i) the address comparison circuit for receiving at least one of the first and second addresses, (ii) the buffer for receiving the buffered data, (iii) the level control circuit for receiving the empty signal, and (iv) the command generator for receiving one or more commands. The control circuit generates the abort signal based on the empty signal, a boundary address and the at least one of the first and second addresses. The boundary address is a last address of a section of the memory. The control circuit also generates the read control data based on the size of the buffered data and a select signal based on at least one of the empty signal, the abort signal, and the at least one command. The control circuit outputs the buffered data as buffered write data, based on the select signal, to the memory where the buffered data is stored. Thus, the memory controller stores the first and second write data in the memory.

In another embodiment of the present invention, an integrated circuit (IC) includes a processor, a memory controller, and a memory. The processor generates first and second write transactions. The first write transaction includes first write control data, a first address, and first write data. The second write transaction includes second write control data, a second address, and second write data. The memory controller is connected to the processor and receives the first and second write transactions. The memory controller executes the first and second write transactions. The memory controller includes an address comparison circuit, a buffer, a level control circuit, a command generator, and a control circuit. The address comparison circuit is connected to the level control circuit for receiving a stall signal and the processor for receiving the first and second write control data, the first and second addresses, and the first and second write data. The address comparison circuit calculates a third address based on the first write control data and the first address and compares the second address with the third address. The address comparison circuit outputs at least one of the first and second write control data, at least one of the first and second addresses, and the first and second write data based on the stall signal and the comparison of the second and third addresses. The buffer is connected to the address comparison circuit for receiving and storing the first and second write data and the level control circuit for receiving a control signal. The buffer outputs buffered data based on the control signal and the first and second write data. The level control circuit is connected to the control circuit and receives an abort signal and read control data. The level control circuit is connected to the address comparison circuit for receiving the at least one of the first and second write control data and determines a size of the buffered data based on the first write control data and the read control data. The level control circuit compares a size of the buffered data with a threshold size and a predetermined buffer size and generates the control signal based on the comparison of the size of the buffered data and the threshold size, the stall signal based on the comparison of the size of the buffered data and the predetermined buffer size. The command generator is connected to the address comparison circuit for receiving at least one of the first and second write control data and outputs at least one command. The control circuit is connected to the address comparison circuit for receiving at least one of the first and second addresses, the buffer for receiving the buffered data, the level control circuit for receiving the empty signal, and the command generator for receiving one or more commands. The control circuit generates the abort signal based on the empty signal, a boundary address and the at least one of the first and second addresses. The boundary address is a last address of a section of the memory. The control circuit also generates the read control data based on the size of the buffered data and a select signal based on at least one of the empty signal, the abort signal, and the at least one command. The control circuit outputs the buffered data as buffered write data based on the select signal. The memory is connected to the memory controller and receives the buffered write data and the select signal. The memory stores the buffered data. Thus, the memory controller outputs the first and second write data as the buffered write data.

Various embodiments of the present invention provide a memory controller, which is connected to the processor to receive first and second write transactions and stores write data in a memory. The memory controller includes an address comparison circuit, a buffer, a level control circuit, a command generator, and a control circuit. The address comparison circuit compares second and third addresses and outputs first and second write data in a single transaction when the second and third addresses are consecutive. The buffer stores the first and second write data, and outputs the first and second write data as buffered data based on a control signal. The level control circuit compares a size of the buffered data with a threshold size and a size of the buffer and outputs the control signal, a stall signal and an empty signal. The command generator outputs one or more commands for executing the write transaction. The control circuit outputs the buffered data as buffered write data based on a select signal.

Thus, the memory controller decreases the latency in the write transaction by combining the first and second write transactions when the second and third addresses are consecutive. The memory controller also includes the command generator for outputting commands. This reduces the load on the processor because it does not generate the consecutive commands for executing the write transaction. The memory controller receives the write transaction at the input data rate and outputs and stores the write data to the memory at the output data rate. Thus, by reducing the latency, the memory controller reduces the difference between the input data rate and the output data rate, and increases the efficiency of the processor.

Referring now to FIG. 1, a schematic block diagram of an integrated circuit (IC) 100 including a processor 102, a memory controller 104, and a memory 106 in accordance with an embodiment of the present invention is shown. The processor 102 writes data (referred to as write data) to the memory 106 by way of the memory controller 104. The memory controller 104 includes an address comparison circuit 108, a buffer 110, a level control circuit 112, a command generator 114, and a control circuit 116. The processor 102 fetches and stores write data from and to the memory 106 by way of the memory controller 104. The memory 106 may be a NAND flash memory, a NOR flash memory, or a pseudo-static random-access memory (PSRAM).

The processor 102 generates first and second write transactions (collectively referred to as 'write transactions') to transmit first and second write data (collectively referred to as 'write data') to the memory 106. The first write transaction includes first write control data WR_CTRL1, a first address ADDR1, and first write data WR_DAT1. The second write transaction includes second write control data WR_CTRL2, a second address ADDR2, and second write data WR_DAT2.

The first and second write control data WR_CTRL1 and WR_CTRL2 each includes a mode of transaction, a type of transaction, and a transaction length. The modes of transaction include serial and discrete transactions. The types of transaction also include atomic and burst transactions.

The address comparison circuit 108 is connected to the processor 102 to receive the write transactions and the level control circuit 112 to receive a stall signal STALL. The last address of the first write transaction is referred to as a third address ADDR3. The address comparison circuit 108 checks whether the third address ADDR3 and the second address ADDR2 are consecutive.

When the stall signal STALL is in an inactive state and the third address ADDR3 and the second address ADDR2 are consecutive to each other, the address comparison circuit 108 outputs the first and second write data WR_DAT1 and WR_DAT2, the first and second addresses ADDR1 and ADDR2, and the first write control data WR_CTRL1. In an example, the first address ADDR1 is 0011H, the third address ADDR3 is 0100H, and the second address ADDR2 is 0101H. Thus, the first and second write transactions are consecutive. Therefore, the first write control data WR_CTRL1 executes both the first and second write transactions.

When the stall signal STALL is in the inactive state and the third address ADDR3 and the second address ADDR2 are not consecutive to each other, the address comparison circuit 108 outputs the first and second write data WR_DAT1 and WR_DAT2, the first and second addresses ADDR1 and ADDR2, and the first and second write control data WR_CTRL1 and WR_CTRL2.

When the stall signal STALL is in an active state, the address comparison circuit 108 outputs a ready signal READY in the inactive state to halt the transmission of the first and second write transactions from the processor 102. Thus, the address comparison circuit 108 does not receive the first and second write transactions and consequently does not output the first and second write data WR_DAT1 and WR_DAT2, the first and second write control data WR_CTRL1 and WR_CTRL2, and the first and second addresses ADDR1 and ADDR2.

The buffer 110 is connected to the address comparison circuit 108 to receive the first and second write data WR_DAT1 and WR_DAT2, and the level control circuit 112 to receive a control signal CTRL. When the control signal CTRL is in the inactive state, the buffer 110 stores the first and second write data WR_DAT1 and WR_DAT2. When the control signal CTRL is in the active state, the buffer 110 outputs the first and second write data WR_DAT1 and WR_DAT2 as the buffered data BFFR_DAT. The buffer 110 is empty when the processor 102 has no write data to store in the memory 106.

The level control circuit 112 is connected to the address comparison circuit 108 to receive one of the first and second write control data WR_CTRL1 and WR_CTRL2 and to the control circuit 116 to receive a read control signal RD_CTRL in order to determine a size of the buffered data BFFR_DAT. The size of the buffered data BFFR_DAT is the number of bytes of data stored in the buffer 110. A predetermined buffer size indicates the maximum number of bytes of data that may be stored in the buffer 110.

The level control circuit 112 compares the size of the buffered data BFFR_DAT with the threshold size. When the size of the buffered data BFFR_DAT equals the threshold size, the level control circuit 112 outputs the control signal CTRL in the active state. When the size of the buffered data BFFR_DAT is not equal to the threshold size, the control signal CTRL is in the inactive state.

The level control circuit 112 also compares the size of the buffered data BFFR_DAT with the predetermined buffer size. When the size of the buffered data BFFR_DAT equals the predetermined buffer size, the level control circuit 112 outputs the stall signal STALL in the active state. The level control circuit 112 outputs an empty signal EMPTY in the active state when the buffer 110 is empty.

The command generator 114 receives the first write control data WR_CTRL1 and outputs one or more commands CMD. The command CMD is an instruction given to the memory controller 104 to perform the write transaction and store the buffered data BFFR_DAT in the memory 106. Examples of the commands CMD include a write enable command, an address latch enable command, and a reset signal.

The memory 106 includes multiple pages to store the write data. A boundary address BDRY_ADDR of a page is the last address of the page and indicates a page boundary. The control circuit 116 is connected to the address comparison circuit 108 to receive the first and second addresses ADDR1 and ADDR2, the buffer 110 to receive the buffered data BFFR_DAT, the level control circuit 112 to receive the empty signal EMPTY, and the command generator 114 to receive the commands CMD.

The control circuit 116 increments the first and second write addresses ADDR1 and ADDR2. A fourth address ADDR4 is an address in at least one of the first and second write transactions. When the fourth address ADDR4 equals the boundary address BDRY_ADDR, the control circuit 116 detects the page boundary and outputs the abort signal ABORT in the active state.

In an example, the first address ADDR1 is 00110H, the third address ADDR3 is 01000H, and the boundary address BDRY_ADDR is 00111H. The fourth address ADDR4, i.e., 00111H, is an address in the first write transaction and equals the boundary address BDRY_ADDR. Therefore, the control circuit 116 outputs the abort signal ABORT in the active state.

The control circuit 116 outputs a select signal SLCT in the active state when it receives the commands CMD. The control circuit 116 outputs the select signal SLCT in the inactive state when the abort signal ABORT or the empty signal EMPTY is in the active state.

The control circuit 116 determines that the buffered data BFFR_DAT should be stored in the memory 106 based on the select signal SLCT. The control circuit 116 outputs the buffered data BFFR_DAT as buffered write data BFFR_WR_DAT. The memory controller 104 stores the buffered write data BFFR_WR_DAT in the memory 106 when the select signal SLCT is in the active state. The memory controller 104 does not store the buffered write data BFFR_WR_DAT in the memory 106 when the select signal SLCT is in the inactive state.

In operation, the address comparison circuit 108 receives the first and second write transactions from the processor 102. The address comparison circuit 108 then compares the second and third addresses ADDR2 and ADDR3. In one embodiment, when the second and third addresses ADDR2 and ADDR3 are consecutive, the address comparison circuit 108 outputs the first and second write data WR_DAT1 and WR_DAT2 to the buffer 110, the first and second addresses ADDR1 and ADDR2 to the control circuit 116, and the first write control data WR_CTRL1 to the command generator 114 and the level control circuit 112.

The buffer 110 receives and stores the first and second write data WR_DAT1 and WR_DAT2. The level control circuit 112 checks the size of the buffered data BFFR_DAT at each clock cycle and compares it with the threshold size and the predetermined buffer size. In one embodiment, the memory controller 104 operates according to the clock cycles of a clock signal received from the processor 102. When the size of the buffered data BFFR_DAT equals the threshold size, the level control circuit 112 outputs the control signal CTRL in the active state within a predetermined number of clock cycles and the buffer 110 outputs the first and second write data WR_DAT1 and WR_DAT2 as the buffered data BFFR_DAT.

In one embodiment, the buffer 110 does not receive the control signal CTRL in the active state and the size of the buffered data BFFR_DAT equals the predetermined buffer size in a first clock cycle within the predetermined number of clock cycles. Thus, the level control circuit 112 outputs the stall signal STALL in the active state in the first clock cycle and deactivates the address comparison circuit 108.

When the buffer 110 receives the control signal CTRL in a second clock cycle in the active state and outputs the buffered data BFFR_DAT, the level control circuit 112 compares the size of the buffered data BFFR_DAT with the predetermined buffer size and the threshold size. When the buffer 110 outputs the buffered data BFFR_DAT, the size of the buffered data BFFR_DAT is not equal to the predetermined buffer size and the threshold size. Therefore, the level control circuit 112 outputs the stall signal STALL in the inactive state in the second clock cycle and activates the address comparison circuit 108.

The command generator 114 receives the first and second write control data WR_CTRL1 and WR_CTRL2. In one embodiment, the command generator 114 receives only the first write control data WR_CTRL1 and interprets the first and second write transactions as one transaction, and outputs the commands CMD to execute the first and second write transactions.

The control circuit 116 receives the commands CMD from the command generator 114 and outputs the select signal SLCT. The control circuit 116 outputs the buffered write data BFFR_WR_DAT when the select signal SLCT is in the active state. In one embodiment, when the fourth address ADDR4 equals the boundary address BDRY_ADDR, the control circuit 116 outputs the abort signal ABORT in the active state and the select signal SLCT in the inactive state. The level control circuit 112 generates the control signal CTRL in the inactive state when the abort signal ABORT is in the active state. Consequently, the buffer 110 stops outputting the buffered data BFFR_DAT and the control circuit 116 does not output the buffered write data BFFR_WR_DAT.

In a third clock cycle, when the fourth address ADDR4 is not equal to the boundary address BDRY_ADDR, the control circuit 116 outputs the abort signal ABORT in the inactive state and the level control circuit 112 outputs the stall signal STALL in the inactive state and the control signal CTRL in the active state. Consequently, the buffer 110 resumes outputting the buffered data BFFR_DAT.

The level control circuit 112 outputs the empty signal EMPTY in the active state when the buffer 110 is empty. The buffer 110 is empty when the processor 102 has no write data to store in the memory 106. Therefore, the control circuit 116 outputs the select signal SLCT in the inactive state and the write transaction is stopped.

Thus, the memory controller 104 decreases the latency in the write transaction by combining the first and second write transactions when the second and third addresses ADDR2 and ADDR3 are consecutive. The memory controller 104 also includes the command generator 114 for outputting commands CMD. This reduces the load on the processor 102, which does not generate the commands CMD to execute the write transaction. The memory controller 104 receives the write transaction at the input data rate and outputs and stores the write data WR_DAT to the memory 106 at the output data rate. Thus, by reducing the latency, the memory controller 104 reduces the difference between the input data rate and the output data rate, and increases the efficiency of the processor 102.

Figure 2:
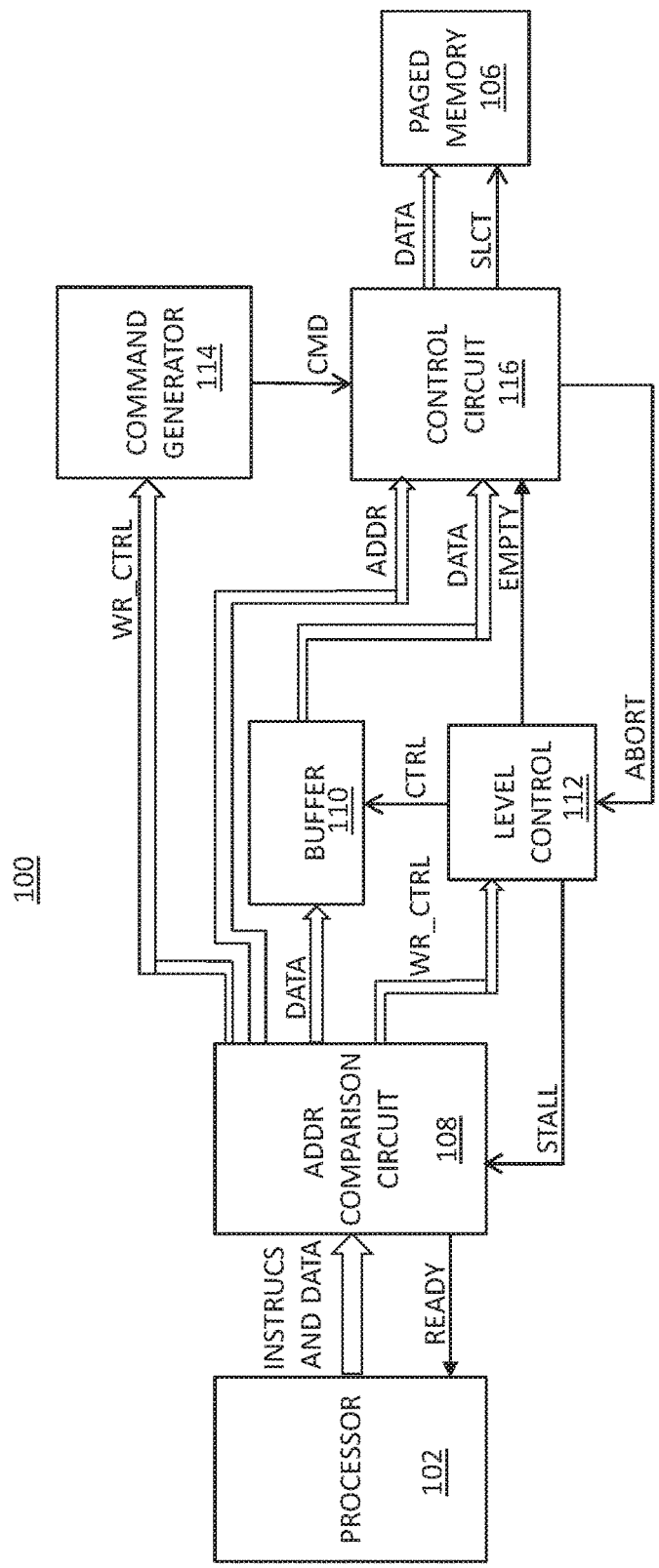
FIG. 2 is a schematic diagram similar to FIG. 1, but highlights the flow of data through the IC.
Figure 3:
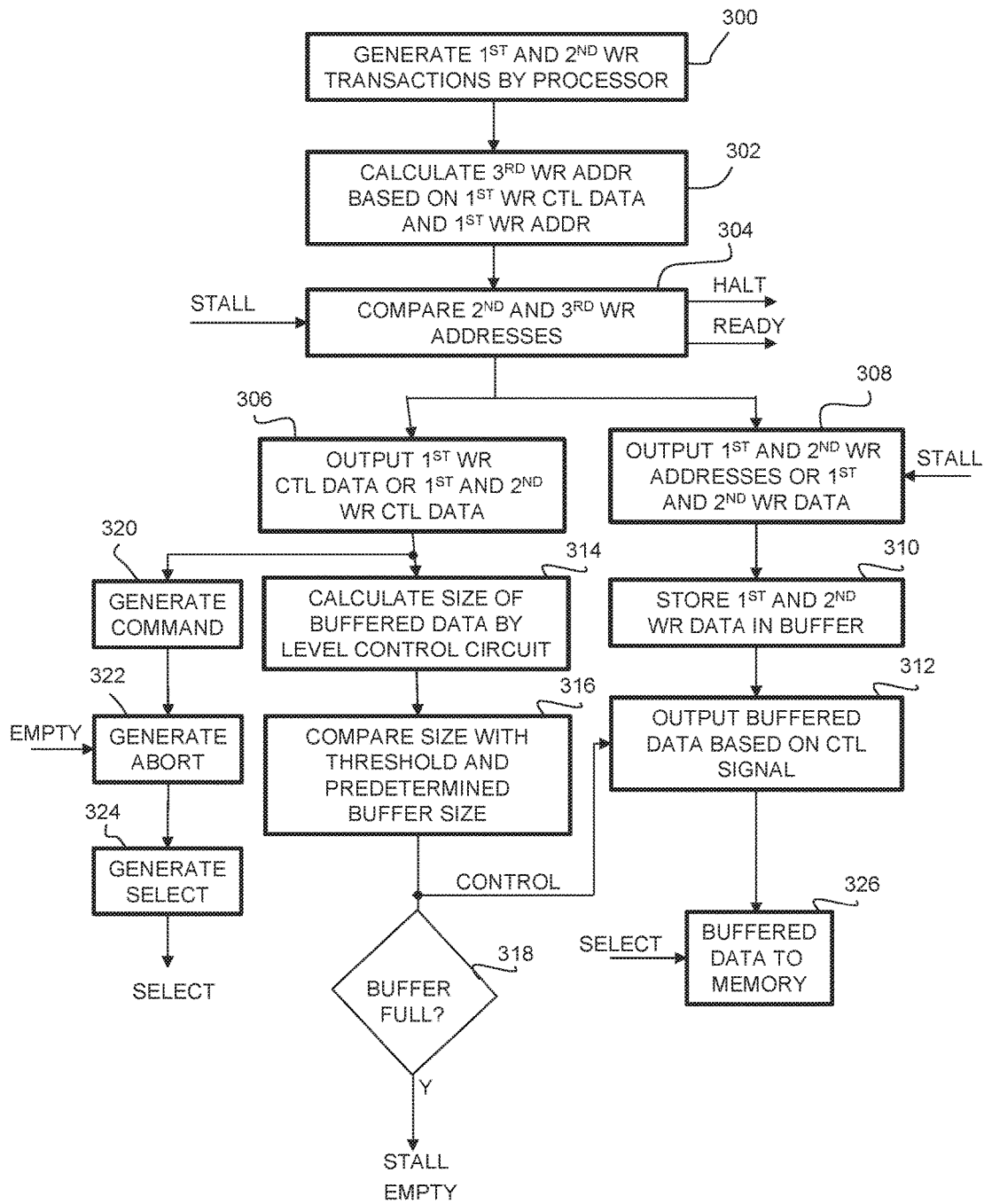
FIG. 3 is a flow chart in accordance with an embodiment of the present invention.

FIG. 3 is a flow chart illustrating the operation of the IC 100 of FIGS. 1 and 2. At step 300, the processor 102 generates first and second write transactions. The first write transaction includes first write control data, a first address, and first write data, and the second write transaction includes second write control data, a second address, and second write data. The memory controller 104 receives and executes the first and second write transactions in. the following manner. At step 302, the address comparison circuit 108 receives the first and second write transactions, and calculates a third address based on the first write control data and the first address. At step 304, the address comparison circuit 108 compares the second address with the third address, and at step 306, outputs at least one of the first write control data, and the first and second write control data, and at step 308, outputs at least one of the first and second addresses, and the first and second write data based on the comparison of the second and third addresses at step 304. It is noted that the address comparison circuit 108 outputs a ready signal when the stall signal is active. At step 308, the address comparison circuit 108 outputs the first write control data when the second address is consecutive to the third address and the stall signal is in an inactive state. The address comparison circuit 108 also outputs the first and second write control data when the second address is not consecutive to the third address and the stall signal (generated in step 318 described below) is in the inactive state. At step 310, the buffer 110 receives a control signal and the first and second write data, and stores the first and second write data, and at step 312, the buffer 110 outputs buffered data based on the control signal and the first and second write data.

At step 314 the level control circuit 112 receives an abort signal, and the at least one of the first write control data, and the first and second write control data, and determines a size of the buffered data based on the received write control data. At step 316 the level control circuit 112 compares the size of the buffered data with both a threshold size and a predetermined buffer size, and then generates the control signal based on the comparison results. The control signal is output in an active state when the size of the buffered data equals the threshold size, and. when the control signal is active, the buffer 110 outputs the buffered data. The level control circuit also generates, at step 318, a stall signal based on the comparison of the size of the buffered data and the predetermined buffer size, when the buffer is full so that the address comparison circuit 108 can instruct the processor 102 to halt issuing a next write transaction. The stall signal is output in an active state when the size of the buffered data equals the predetermined buffer size. The empty signal is output in an inactive when the buffer is empty.

At step 320, the command generator 114 receives the at least one of the first write control data, and the first and second write control data from the address comparison circuit 108, and generates at least one command based on the received write control data. The control circuit 116 receives the at least one of the first and second addresses from the address comparison circuit 108, receives the buffered data from the buffer 110, and the at least one command from the command generator 114. Then the control circuit 116, at step 322, generates the abort signal based on an empty signal, a boundary address, and the at least one of the first and second addresses. In one embodiment, the control circuit 116 calculates a fourth address based on the at least one of the first and second addresses, and outputs the abort signal in an active state when the fourth address equals the boundary address, and at least one of the first and second write transactions includes the fourth address. The boundary address is a last address of a section of the memory. The control circuit 116 also generates a select signal, at step 324, based on at least one of the abort signal and the command. The control circuit 116 also outputs the select signal in an active state when it receives the at least one command, and in an inactive state when at least one of the abort signal and the empty signal is in the active state. At step 326, the buffered data is output to the memory as buffered write data based on the select signal (i.e., when the select signal is active, the control circuit 116 also outputs the buffered write data.

The memory 106 receives the buffered write data and the select signal and stores the buffered write data when the select signal is active. In this way, the memory controller 104 executes the first and second write transactions.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit (IC), comprising:
   a processor that generates first and second write transactions, wherein the first write transaction includes first write control data, a first address, and first write data, and the second write transaction includes second write control data, a second address, and second write data;
   a memory controller connected to the processor for receiving and executing the first and second write transactions, wherein the memory controller comprises:
      an address comparison circuit that (i) receives the first and second write transactions, (ii) calculates a third address based on the first write control data and the first address, (iii) compares the second address with the third address, and (iv) outputs at least one of the first write control data, and the first and second write control data, at least one of the first and second addresses, and the first and second write data based on the comparison of the second and third. addresses;
      a buffer that receives a control signal and is connected to the address comparison. circuit for receiving and storing the first and second write data, and outputting buffered data based on the control signal and the first and second write data;
      a level control circuit that (i) receives an abort signal, (ii) is connected to the buffer and the address comparison circuit, (iii) receives the at least one of the first write control data, and. the first and second write control data, (iv) determines a size of the buffered data based on the received write control data, (v) compares the size of the buffered data with both a threshold size and a predetermined buffer size, (vi) generates the control signal based on the comparison results, and (vii) generates a stall signal based on the comparison of the size of the buffered data and the predetermined buffer size, wherein the stall signal is provided to the address comparison circuit when the buffer is full so that the address comparison circuit can instruct the processor to halt issuing a next write transaction;
      a command generator connected to the address comparison circuit for receiving the at least one of the first write control data, and the first and second write control data and generating at least one command based on the received write control data; and
      a control circuit connected to (i) the address comparison circuit for receiving the at least one of the first and second addresses, (ii) the buffer for receiving the buffered data, (iii) the command generator for receiving the at least one command, and (iv) the level control circuit,
         wherein the control circuit generates (i) the abort signal based on an empty signal, a boundary address, and the at least one of the first and second addresses, and (ii) a select signal based on at least one of the abort signal and the at least one command, and wherein the control circuit outputs the buffered data as buffered write data; and
   a memory connected. to the memory controller for receiving the buffered write data and the select signal and storing the buffered write data when the select signal is active, wherein the boundary address is a last address of a section of the memory,
   whereby the memory controller stores the first and second write data in the memory, thereby executing the first and second write transactions.

2. The IC of claim 1, wherein the address comparison circuit outputs:
   the first write control data when the second address is consecutive to the third address and the stall signal is in an inactive state, and
   the first and second write control data when the second address is not consecutive to the third address and the stall signal is in the inactive state.

3. The IC of claim 2, wherein the level control circuit outputs the stall signal in an active state to the address comparison. circuit when the size of the buffered data equals the predetermined buffer size.

4. The IC of claim 1, wherein the level control circuit outputs the empty signal in an active state when the buffer is empty.

5. The IC of claim 1, wherein the level control circuit outputs the control signal in an active state when the size of the buffered data equals the threshold size.

6. The IC of claim 5, wherein the buffer outputs the buffered data when the control signal is in the active state.

7. The IC of claim 1, wherein:
the control circuit calculates a fourth address based on the at least one of the first and second addresses,
the control circuit outputs the abort signal in an active state when the fourth address equals the boundary address, and
at least one of the first and second write transactions includes the fourth address.

8. The IC of claim. 1, wherein the control circuit outputs:
the select signal in an active state when the control circuit receives the at least one command,
the select signal in an inactive state when at least one of the abort signal and the empty signal is in the active state, and
the buffered write data when the select signal is in the active state.

9. The IC of claim 1, wherein each of the first and second write transactions is at least one of an atomic and a burst transaction, and wherein the third address is equal to the first address when the first transaction is the atomic transaction, and wherein the third address is a last address of the first transaction when the first transaction is the burst transaction.

10. The IC of claim 1, wherein the address comparison circuit outputs a ready signal to the processor when the stall signal is active to halt the processor sending additional write transactions to the memory controller.

11. A memory controller for executing first and second write transactions and storing first and second write data in a memory, wherein the memory controller is connected to a processor that provides the first and second write transactions and the first and second write data, and wherein the first write transaction includes first write control data, a first address, and the first write data and the second write transaction includes second write control data, a second. address, and the second write data, the memory controller comprising:
an address comparison circuit connected to the processor for receiving the first and second write transactions, wherein the address comparison circuit (i) calculates a third address based on the first write control data and the first address, (ii) compares the second address with the third address, and (iii) outputs at least one of the first write control data, and the first and second write control data, at least one of the first and second addresses, and the first and second write data based on the comparison of the second and third addresses;
a buffer that receives a control signal and is connected to the address comparison circuit for receiving and storing the first and second write data, and outputting buffered data based on the control signal and the first and second write data;
a level control circuit that receives an abort signal, (ii) is connected to the buffer and the address comparison circuit for receiving the at least one of the first write control data, and the first and second write control data, (iii) determines a size of the buffered data based on the first write control data, (iv) compares the size of the buffered data with both a threshold size and a predetermined buffer size, and (v) generates the control signal based on the comparison of the size of the buffered data and the threshold size, and a stall signal based on the comparison of the size of the buffered data and the predetermined buffer size, wherein the stall signal is provided to the address comparison circuit when the buffer is full so that the address comparison circuit can instruct the processor to halt issuing a next write transaction;
a command generator connected to the address comparison circuit for receiving the at least one of the first write control data. and the first and second write control data, and generating at least one command therefrom; and
a control circuit connected to: (i) the address comparison circuit for receiving the at least one of the first and second addresses, (ii) the buffer for receiving the buffered data, (iii) the command generator for receiving the at least one command, and (iv) the level control circuit, wherein the control circuit generates: (i) the abort signal when the buffer is empty, a boundary address, and the at least one of the first and second addresses, wherein the boundary address is a last address of a section of the memory, and (ii) a select signal based on at least one of the abort signal and the at least one command, and wherein the control circuit outputs the buffered data as buffered write data, wherein the buffered data comprises the first and second write data, and the buffered write data is stored in the memory when the select signal is active,
whereby the control circuit stores the first and second write data and thereby executes the first and second write transactions.

12. The memory controller of claim 11, wherein the address comparison circuit outputs the first write control data when the second address is consecutive to the third address and the stall signal is in an inactive state, and wherein the address comparison circuit outputs the first and. second write control data when the second address is not consecutive to the third address and the stall signal is in the inactive state.

13. The memory controller of claim 12, wherein the level control circuit outputs the stall signal in an active state to the address comparison circuit when the size of the buffered data equals the predetermined buffer size.

14. The memory controller of claim 11, wherein the level control circuit outputs an empty signal in the active state when the buffer is empty.

15. The memory controller of claim 11, wherein the level control circuit outputs the control signal in the active state when the size of the buffered data equals the threshold size.

16. The memory controller of claim 15, wherein the buffer outputs the buffered data when the control signal is in the active state.

17. The memory controller of claim 11, wherein the control circuit calculates a fourth address based on the at least one of the first and second addresses and outputs the abort signal in the active state when the fourth address equals the boundary address, and wherein at least one of the first and second write transactions includes the fourth address.

18. The memory controller of claim 11, wherein the control circuit outputs the select signal in the active state when the control circuit receives the at least one command and outputs the select signal in the inactive state when at least one of the abort signal and the empty signal is in the active state, and wherein the control circuit outputs the buffered write data when the select signal is in the active state.

19. The memory controller of claim 11, wherein:
each of the first and second write transactions is at least one of an atomic transaction and a burst transaction,
the third address is equal to the first address when the first transaction is the atomic transaction, and
the third address is a last address of the first transaction when the first transaction is the burst transaction.

20. The memory controller of claim 11, wherein the address comparison circuit outputs a ready signal to the processor when the stall signal is active to halt the processor sending additional write transactions to the memory controller.

* * * * *